(12) United States Patent
Kato

(10) Patent No.: US 7,062,691 B2
(45) Date of Patent: *Jun. 13, 2006

(54) METHOD AND APPARATUS FOR DISPLAYING TEST RESULTS AND RECORDING MEDIUM

(75) Inventor: Toshiaki Kato, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 66 days.

This patent is subject to a terminal disclaimer.

(21) Appl. No.: 10/458,637

(22) Filed: Jun. 11, 2003

(65) Prior Publication Data

US 2003/0217317 A1 Nov. 20, 2003

Related U.S. Application Data

(63) Continuation of application No. 09/526,211, filed on Mar. 15, 2000, now Pat. No. 6,601,201.

(30) Foreign Application Priority Data

Jul. 2, 1999 (JP) .......................................... 11-188852

(51) Int. Cl.
*G01R 31/28* (2006.01)

(52) U.S. Cl. ......................................... 714/724; 714/57
(58) Field of Classification Search ................ 714/724, 714/57, 48, 704, 46; 700/110
See application file for complete search history.

(56) References Cited

U.S. PATENT DOCUMENTS

| 5,528,748 A | * | 6/1996 | Wallace ........................ 714/25 |
| 6,389,565 B1 | | 5/2002 | Ryan et al. |
| 6,553,522 B1 | * | 4/2003 | Dalal et al. .................. 714/724 |
| 6,601,201 B1 | * | 7/2003 | Kato ........................... 714/724 |

FOREIGN PATENT DOCUMENTS

| JP | 7-240445 | 9/1995 |
| JP | 9-237810 | 9/1997 |
| JP | 11-119960 | 4/1999 |

* cited by examiner

Primary Examiner—Phung M. Chung
(74) Attorney, Agent, or Firm—Rabin & Berdo, PC (57) ABSTRACT

There are provided a method and an apparatus for displaying test results and a recording medium, which allow easy detection of Devices for Testing in which probes are destroyed. The apparatus has two wafer probers, a work station, and a PC. On the basis of a display program and a display mode switching program stored in a ROM of the work station, respective test results of testing semiconductor chips by the two wafer probers are displayed on a CRT of the PC in correspondence to positions of the semiconductor chips on a wafer substrate, and, at the same time, a pass/fail ratio for each of the DFT's is displayed in parallel with the test results of the semiconductor chips.

9 Claims, 10 Drawing Sheets

FIRST PROBE DEVICE
TESTED: 488 PASSED: 416 FAILED: 72 YIELD: 85.2%

| DFT No. | TOTAL NUMBER | DETECTION RATIO OF GOOD PRODUCTS | DETECTION RATIO OF VOLTAGE FAILURE | DETECTION RATIO OF OPERATION FAILURE |
|---|---|---|---|---|
| 1 | 26 | 92.3% | 0.0% | 7.7% |
| 2 | 29 | 82.8% | 10.3% | 6.9% |
| 3 | 31 | 93.5% | 6.5% | 0.0% |
| 4 | 33 | 81.8% | 15.2% | 3.0% |
| 5 | 34 | 79.4% | 2.9% | 17.6% |
| 6 | 33 | 90.9% | 0.0% | 9.1% |
| 7 | 32 | 75.0% | 12.5% | 12.5% |
| 8 | 26 | 84.6% | 3.8% | 11.5% |
| 9 | 26 | 92.3% | 3.8% | 3.8% |
| 10 | 29 | 96.6% | 0.0% | 3.4% |
| 11 | 31 | 74.2% | 9.7% | 16.1% |
| 12 | 33 | 84.8% | 6.1% | 9.1% |
| 13 | 34 | 94.1% | 2.9% | 2.9% |
| 14 | 33 | 84.8% | 9.1% | 6.1% |
| 15 | 32 | 81.3% | 12.5% | 6.3% |
| 16 | 26 | 76.9% | 11.5% | 11.5% |

FIG 3B

SECOND PROBE DEVICE
TESTED: 433 PASSED: 360 FAILED: 73 YIELD: 83.1%

| DFT No. | TOTAL NUMBER | DETECTION RATIO OF GOOD PRODUCTS | DETECTION RATIO OF VOLTAGE FAILURE | DETECTION RATIO OF OPERATION FAILURE |
|---|---|---|---|---|
| 1 | 25 | 76.0% | 4.0% | 20.0% |
| 2 | 27 | 74.1% | 3.7% | 22.2% |
| 3 | 28 | 82.1% | 14.3% | 3.6% |
| 4 | 30 | 76.7% | 20.0% | 3.3% |
| 5 | 30 | 86.7% | 3.3% | 10.0% |
| 6 | 29 | 89.7% | 3.4% | 6.9% |
| 7 | 27 | 74.1% | 18.5% | 7.4% |
| 8 | 21 | 85.7% | 0.0% | 14.3% |
| 9 | 25 | 100.0% | 0.0% | 0.0% |
| 10 | 27 | 88.9% | 11.1% | 0.0% |
| 11 | 28 | 96.4% | 0.0% | 3.6% |
| 12 | 29 | 79.3% | 13.8% | 6.9% |
| 13 | 30 | 93.3% | 0.0% | 6.7% |
| 14 | 29 | 86.2% | 6.9% | 6.9% |
| 15 | 27 | 74.1% | 14.8% | 11.1% |
| 16 | 21 | 85.7% | 4.8% | 9.5% |

| LEVEL OF CHIP | DETECTED NUMBER OF CHIPS |
|---|---|
| 1 | |
| 2 | |
| 3 | |
| 4 | |
| 5 | |
| 6 | |
| 7 | |

METHOD AND APPARATUS FOR DISPLAYING TEST RESULTS AND RECORDING MEDIUM

CROSS REFERENCE TO RELATED APPLICATION

This is a continuation of application Ser. No. 09/526,211, filed Mar. 15, 2000, now U.S. Pat. No. 6,601,201.

BACKGROUND OF THE INVENTION

1. Field of the Invention

The present invention relates to an apparatus and method for displaying test results, and to a recording medium, and in particular, to an apparatus and method for displaying results of a test in which each of a plurality of semiconductor chips formed on a wafer substrate is tested, and to a recording medium on which a display program is recorded.

2. Description of the Prior Art

Conventionally, for example, a predetermined voltage is applied to each of the semiconductor chips formed on a wafer substrate to carry out a test (a probe test or the like) to check whether memories and devices formed on the semiconductor chips are operating in a normal state by checking whether a predetermined voltage value which the chip was designed to exhibit is in fact detected when the predetermined voltage is applied to the semiconductor chips. In this way, the quality of the chips (memories and devices) is checked.

Figure 6:
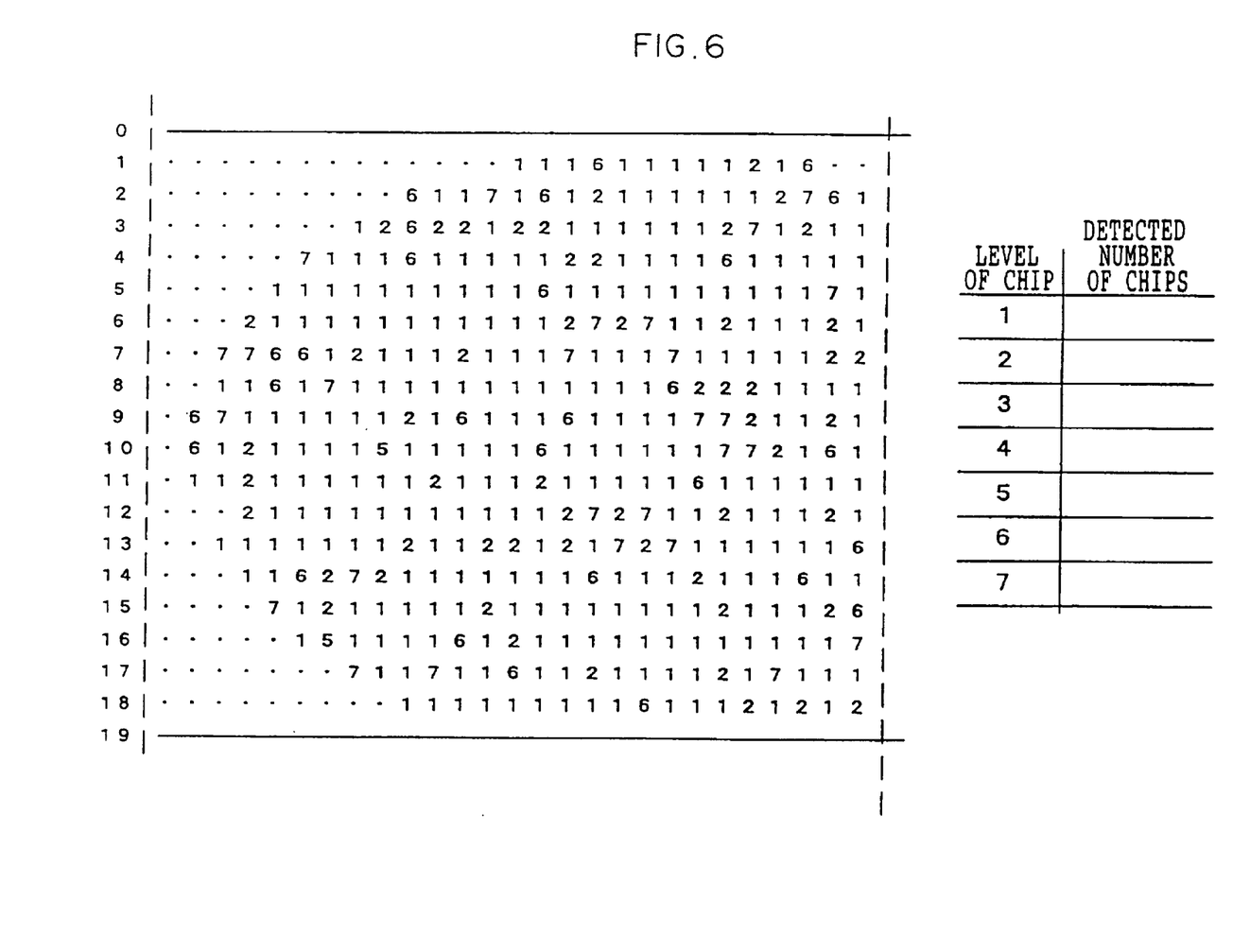
FIG. 6 is an explanatory view showing a display example of test results by a conventional wafer prober (probe device).

At this time, as shown in FIG. 6, numbers (1–7) indicative of the results of the test of the chips are displayed on a screen in correspondence with the each of positions of the semiconductor chips on the wafer substrate. At the same time, the number of semiconductor chips detected as having a given value (one of 1–7) is displayed on the screen for each of the detected values. These numbers (1–7) indicate the quality level of the semiconductor chips. For example, the number 1 denotes a good quality, 2 denotes a quality that can be made good through a very simple correction processing, 3 denotes a quality that can be made good through a relatively simple correction processing, 4 denotes a quality that can be made good through a complicated correction processing, 5 denotes a device failure (defective device), 6 denotes a memory failure, and 7 denotes a function failure. The quality level is determined every time in accordance with the test contents and the test results.

By summing up such quality level, the quality level (failure level) in which the detected number of the semiconductor chips is large is clarified. The causes of the failure are investigated and the results of the investigation are fed back to the manufacturing step for the prevention of failures for the same reason the next time the product is manufactured.

Generally, in testing semiconductor chips, a wafer prober or the like is used which has a tester having a plurality of groups of probes which are each a test portion for testing one semiconductor chip. The wafer prober is used to carry out parallel measurement for testing a plurality of semiconductor chips at the same time, thereby shorting the test time.

Figure 7:
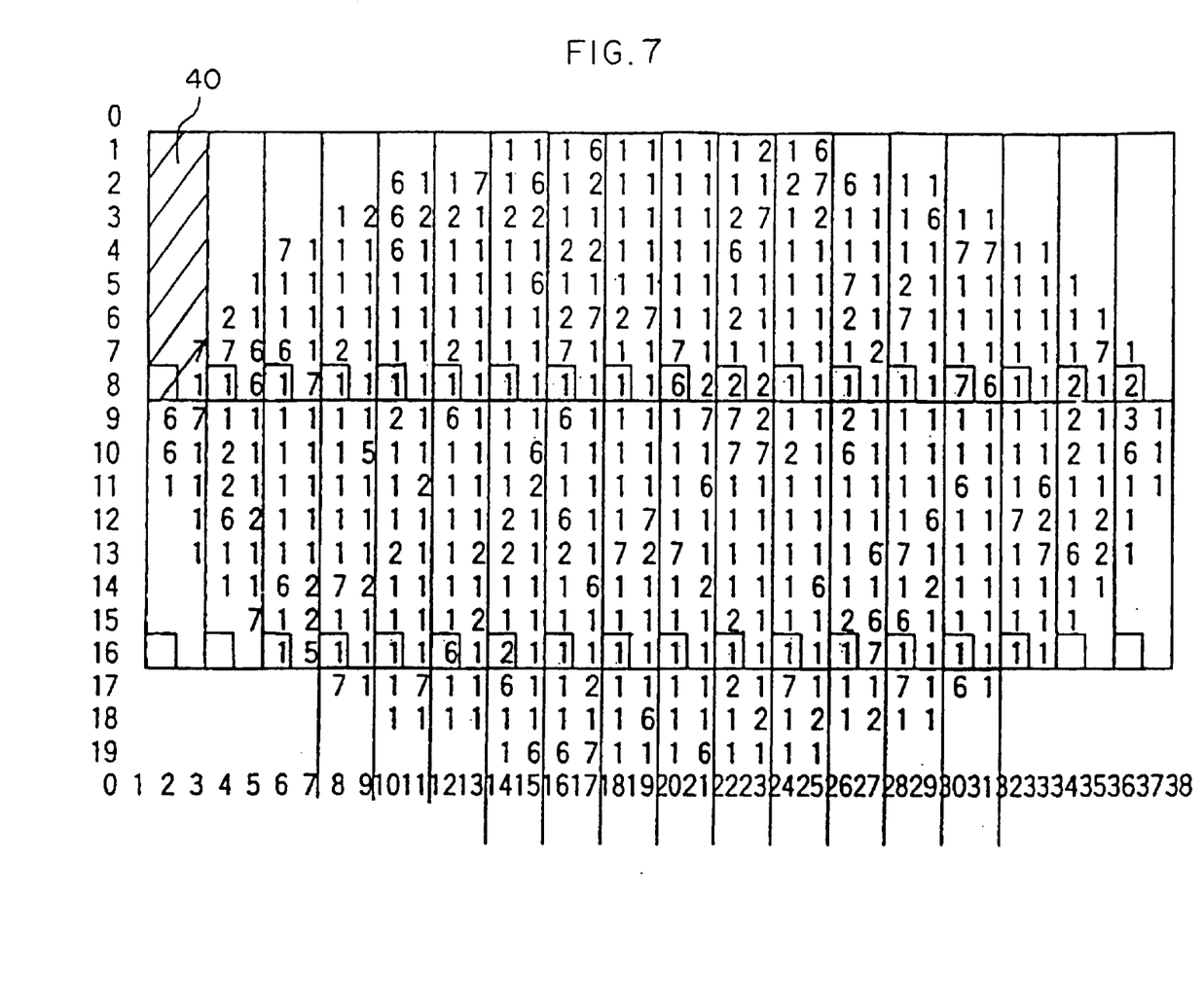
FIG. 7 is a view for explaining movement of a test region in a conventional wafer prober in which movement of a tester is limited.

For example, there will be considered a case of a wafer prober in which a tester having sixteen groups of probes arranged in eight rows and two columns is provided. The semiconductor chips formed on the wafer substrate are positioned in rows and columns as shown in FIG. 7. As shown in FIG. 7, the tester is disposed at a test start reference position (the slanted line region of FIG. 7). In the case where a semiconductor chip corresponding to at least one of the sixteen groups of probes of the tester is present, the semiconductor chip is tested by the group of probes corresponding thereto. When the test by the groups of probes is completed, the tester is shifted two rows, and a test region 40 is shifted by two rows. When a semiconductor chip is present which corresponds to at least one of the probes, the semiconductor chip is tested with the group of probes corresponding thereto. When testing of all the semiconductor chips formed at the positions of rows one to eight on the wafer substrate is completed by repeating the aforementioned process, the tester is returned to the test start reference position and is shifted eight columns. Thereafter, testing of the semiconductor chips formed at the positions of rows nine to sixteen on the wafer substrate is carried out as described above.

By repeating such operations, all of the 536 semiconductor chips formed on one wafer substrate are tested by the movement of the tester 48 times (carrying out testing 48 times).

Figure 8:
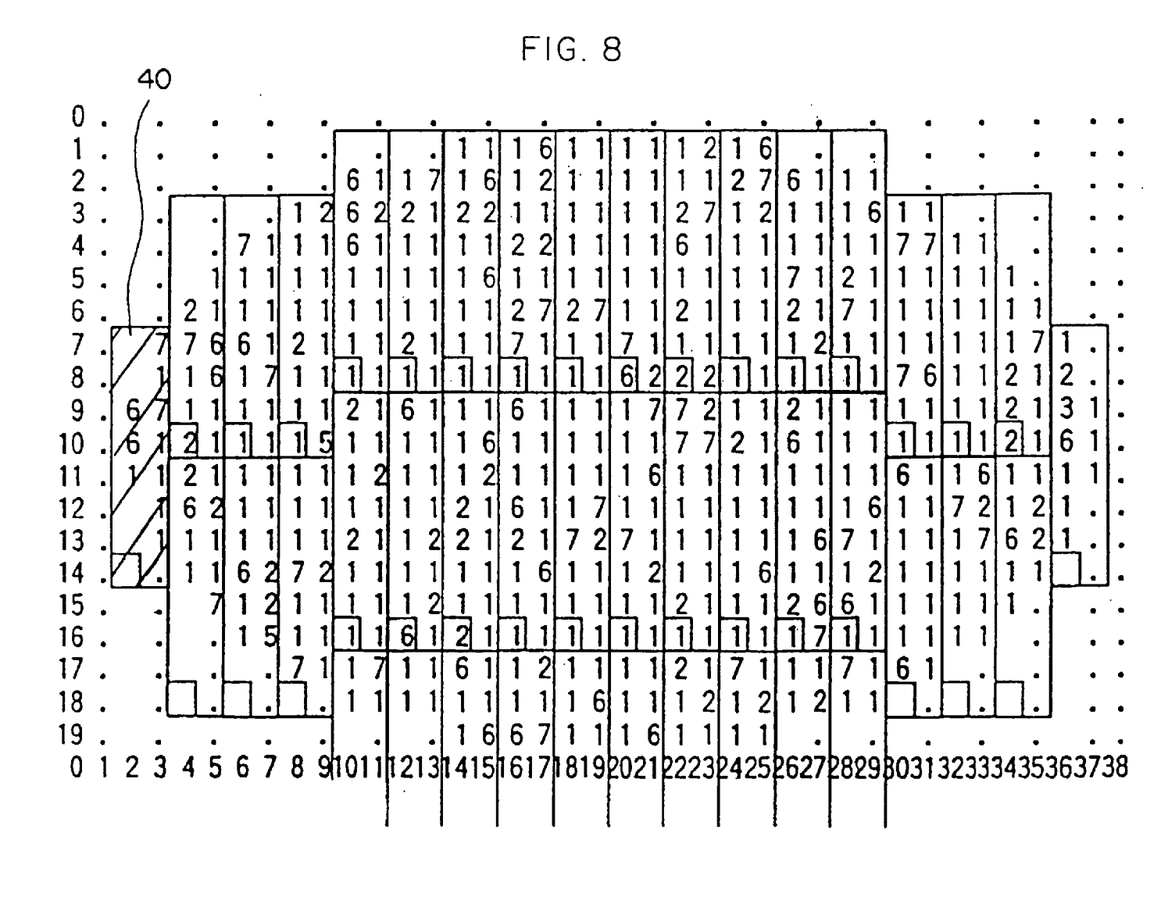
FIG. 8 is a view for explaining movement of a test region in a conventional wafer prober in which movement of a tester is not limited.

Shortening of the test time is important in terms of improving manufacturing efficiency. Conventionally, there has been proposed a wafer prober that is capable of moving the tester freely in order to carry out testing in a short time. As shown in FIG. 8, there is proposed a system in which the test region 40 can be set in correspondence with the configuration of a disc-shaped wafer substrate by moving the tester along the configuration of the disc-like wafer substrate so that the number of times testing is carried out by the tester is decreased.

In the example shown in FIG. 7, all of the 536 semiconductor chips are tested by carrying out testing 48 times. However, by moving the tester in accordance with the configuration of the disc-shaped wafer substrate, it becomes possible to test all of the 536 semiconductor chips in 44 tests. The time required for testing can thus be shortened by the amount of time required for four tests.

Since the semiconductor chips are very small and the electrodes formed on the semiconductor chips are also considerably minute, the probe for applying voltage to the semiconductor chips by contacting the electrode of the chip is also extremely small. As a result, the probe is liable to be broken if a load is applied to the probe during the movement of the tester, or the probe gets caught on the edge of the wafer substrate.

Accurate test results cannot be obtained from damaged probes. Thus, even a good quality semiconductor chip which is subjected to testing may be detected as being a poor product. Such incorrect test results are unfavorable. Therefore, it is necessary to detect at an early stage the fact that the probe has been damaged, so that adjustments to the semiconductor test device can be made and the test instruments can be checked with a view to restoring normal operation in a short time.

Conventionally, when results of testing the semiconductor chip (the quality levels of the semiconductor chips) are displayed on the screen in correspondence to the positions of the semiconductor chips on the substrate, the relative position of the probe with respect to the tester (hereinafter referred to as DFT (Device For Testing)) is displayed on the screen in an overlaid manner on the test results of the semiconductor chips on the monitor, so that the operator can detect the damage caused to the probe as soon as possible.

With a wafer prober in which the movement of the tester is restricted, for example, as shown in FIG. 7, since each of the DFT's is shifted (arranged) along the same column on the wafer substrate, the damage on the probe can be detected relatively easily. However, in a case where testing is carried out by using a wafer prober in which the tester is moved freely, for example, as shown in FIG. 8, the respective DFT's are not necessarily shifted along the same column on the wafer substrate. Thus, it is difficult to detect at an early stage which of the DFT's is damaged.

Furthermore, in recent years, owing to the smaller sizing resulting from the shrinkage or the like of the semiconductor chips and an increase in the diameter of the wafer substrate, the number of chips which can be formed on a single wafer substrate has become very large. As a result, it becomes difficult to display on one screen of the monitor the test results for one wafer substrate. Therefore, only a portion of the test results for one wafer substrate is displayed on one screen of the monitor. For this reason as well, it is difficult to correspond each of the semiconductor chips being tested by the one of the DFT's with each of the DFT's, and thus, it becomes difficult to detect at an early stage which of the probes of the DFT are damaged.

SUMMARY OF THE INVENTION

In view of the aforementioned, the present invention aims to provide a method and an apparatus for displaying test results, and a recording medium, which provide easy detection of which of the probe is damaged.

In order to attain the above object, the first aspect of the present invention is a method for displaying test results comprising the step of: on the basis of test results obtained by a tester provided with plural testing portions, each of the testing portions testing a plurality of semiconductor chips formed on a wafer substrate, displaying on a same screen of displaying means two types of information which are a first information which expresses test results of the semiconductor chips in accordance with positions of the semiconductor chips on the wafer substrate, and a second information which expresses test results of the semiconductor chips for the respective testing portions of the tester.

The second aspect of the present invention is a method for displaying test results according to the first aspect, wherein at least two of the two types of information obtained from at least two testers are displayed on the same screen of the displaying means.

The third aspect of the present invention is a method for displaying test results according to the first or the second aspect, wherein a display mode is switchable between at least three display modes which are a first display mode for displaying only the first information on the screen of the displaying means, a second display mode for displaying only the second information on the screen of the displaying means, and a third display mode for displaying both the first information and the second information on the screen of the displaying means.

The forth aspect of the present invention is a method for displaying test results according to any one of the first to third aspect, wherein the test results of the second information is at least one of a detection ratio of defective semiconductor chip and a value reflecting the detection ratio.

The fifth aspect of the present invention is an apparatus for displaying test results comprising: control means for controlling a displaying means such that, on the basis of test results obtained by a tester provided with plural testing portions, each of the testing portions testing a plurality of semiconductor chips formed on a wafer substrate, the displaying means displays on a same screen two types of information which are a first information which expresses test results of the semiconductor chips in accordance with positions of the semiconductor chips on the wafer substrate, and a second information which expresses test results of the semiconductor chips for the respective testing portions of the tester.

The sixth aspect of the present invention is an apparatus for displaying test results according to fifth aspect, wherein the control means is connected to at least two testers, and controls the displaying means so that at least two of the two types of information which are obtained from each of the testers are displayed on the same screen of the displaying means.

The seventh aspect of the present invention is an apparatus for displaying test results according to fifth or sixth aspect, further comprising switching means for switching a display mode between at least three display modes which are a first display mode for displaying only the first information on the screen of the displaying means, a second display mode for displaying only the second information on the screen of the displaying means, and a third display mode for displaying both the first and the second information on the screen of the displaying means.

The eighth aspect of the present invention is an apparatus for displaying test results according to any one of fifth to seventh aspect, wherein the test results of the second information is at least one of a detection ratio of defective semiconductor chip and a value reflecting the detection ratio.

The ninth aspect of the present invention is a recording medium which can be read by a computer, the medium having a display program recorded therein for, on the basis of test results obtained by a tester provided with plural testing portions, each of the testing portions testing a plurality of semiconductor chips formed on a wafer substrate, displaying on a same screen of displaying means two types of information which are a first information which expresses test results of the semiconductor chips in accordance with positions of the semiconductor chips on the wafer substrate, and a second information which expresses test results of the semiconductor chips for the respective testing portions of the tester.

The tenth aspect of the present invention is a recording medium according to ninth aspect, wherein a parallel display program, for displaying in a parallel manner and on the same screen, at least two sets of the two types of information inputted independently from at least two testers, is also recorded on the recording medium.

The eleventh aspect of the present invention is a recording medium according to ninth or tenth aspect, wherein a display switch program, for switching a display mode between at least three display modes which are a first display mode for displaying only the first information on the screen of the displaying means, a second display mode for displaying only the second information on the screen of the displaying means, and a third display mode for displaying both the first information and the second information on the screen of the displaying means, is also recorded on the recording medium.

The twelfth aspect of the present invention is a recording medium according to any one of ninth to eleventh aspect, wherein the test results of the second information is at least one of a detection ratio of detective semiconductor and a value reflecting the detection ratio.

In other words, in the first aspect, two types of information are displayed on the same screen: first information which expresses test results of the semiconductor chips in accordance with positions on the wafer substrate of the semiconductor chips which have been tested, and second information which expresses the test results of the semiconductor chips, each of the chips being tested by one of the plurality of test portions, for each of the testing portions of the tester. Therefore, the operator can confirm by the first information the test results of the semiconductor chips which are formed on the wafer substrate, and can confirm by the second information the test results of each of the test portions. Consequently, it is easy to confirm the presence of abnormalities in each of the plurality of the test portions, so that breakage of and trouble with the test portions can be immediately detected.

Even in the case where the semiconductor chips which should be tested by the tester are randomly selected, by using the display of the second information, it can immediately be detected whether the test results of any of the plural testing portions are abnormal. Thus, it is possible to detect at an early stage breakage of or trouble with the test portions.

In order to realize the method of the first aspect, for example, as described in the fifth aspect, an apparatus for displaying test results may be provided with a control means for controlling the displaying means so that the two types of information (the first information and the second information) are displayed on the same screen.

Furthermore, as described in the second aspect, the results of simultaneously testing semiconductor chips formed individually on each of at least two wafer substrates can be confirmed at one time by displaying on the same screen at least two of the two kinds of information obtained at least from two testers, thereby increasing efficiency.

In order to realize the method according to the second aspect, as in the sixth aspect, the apparatus for displaying test results may be structured such that a control means controls the display means so that at least two of the aforementioned two kinds of information obtained from at least two testers can be displayed on the same screen.

Furthermore, as in the third aspect, it is possible to selectively display only information required by the operator by switching between at least three display modes which are a first display mode for displaying only the first information, a second display mode for displaying only the second information, and a third display mode for displaying both the first and second information.

In order to realize the method according to the third aspect, for example, as in the seventh aspect, the apparatus for displaying test results may be structured so as to further comprise switching means for switching the display mode of the displaying means between at least the three display modes which are the first display mode, the second display mode, and the third display mode.

In this case, as in the second and the sixth aspects, the invention is advantageous in cases where there is a large amount of display information, as in the case where testing of the semiconductor chips formed on each of at least two wafer substrates is carried out simultaneously in a parallel manner.

On the basis of test results obtained by a tester provided with plural testing portions, each of the testing portions testing a plurality of semiconductor chips formed on a wafer substrate, the method for displaying test results of the first aspect and the apparatus for displaying test results of the fifth aspect effect processing on the basis of a display program for displaying on a same screen of displaying means two types of information which are a first information which expresses test results of the semiconductor chips in accordance with positions of the semiconductor chips on the wafer substrate, and second information which expresses test results of the semiconductor chips for the respective testing portions of the tester.

This display program is recorded on a recording medium that can be read by a computer, as in the ninth aspect. Thus, the display program can be applied such that after the display program is installed from the recording medium onto a predetermined region of the apparatus for displaying test results, the apparatus for displaying test results is controlled by the program, or such that the display program is directly read from the recording medium and the apparatus for displaying test results is controlled by the program.

Furthermore, in addition to the display program as in the ninth aspect, the recording medium according to the tenth aspect further includes a parallel display program for displaying in a parallel manner and on the same screen at least two sets of the two types of information inputted independently from at least two of the testers, is also recorded on the recording medium. The apparatus for displaying test results as in sixth aspect carries out processing on the basis of this parallel display program.

This parallel display program can be applied such that after the display program is installed from the recording medium onto a predetermined region of the apparatus for displaying test results, the apparatus for displaying test results is controlled, or such that the display program is directly read from the recording medium and the apparatus for displaying test results is controlled.

Furthermore, in addition to the display program as in the ninth or tenth aspect, the recording medium in eleventh aspect further includes a display switching program for switching the display mode of the displaying means between at least three display modes which are a first display mode for displaying only the first information, a second display mode for displaying only the second information, and a third display mode for displaying the first information and the second information. The apparatus for displaying test results of as in seventh aspect carries out processing on the basis of the display switching program.

The display switching program can be applied such that after the display program is installed from the recording medium onto a predetermined region of the apparatus for displaying test results, the apparatus for displaying test results is controlled, or such that the display program is directly read from the recording medium and the apparatus for displaying test results is controlled.

The test results of the first information may be a quality level of the semiconductor chip that is determined each time in accordance with the test contents and the required test results. Furthermore, the test results of the second information may be actual test results such as the quality level of the semiconductor chips, in the same manner as the first information. However, the second information may be at least one of a detection rate of poor products (defective semiconductor chips) or a value reflecting a detection rate as can be seen in the forth, eighth and twelfth aspects. The setting of the second information in this manner is preferable because abnormalities in the test results of the test portions can be clearly displayed.

DESCRIPTION OF THE PREFERRED EMBODIMENTS

Embodiments of the present invention will be explained in detail hereinafter by referring to FIGS. 1 through 4. In the embodiments, the apparatus and the method for displaying test results according to the present invention are applied to a semiconductor chip test apparatus.

Figure 1:
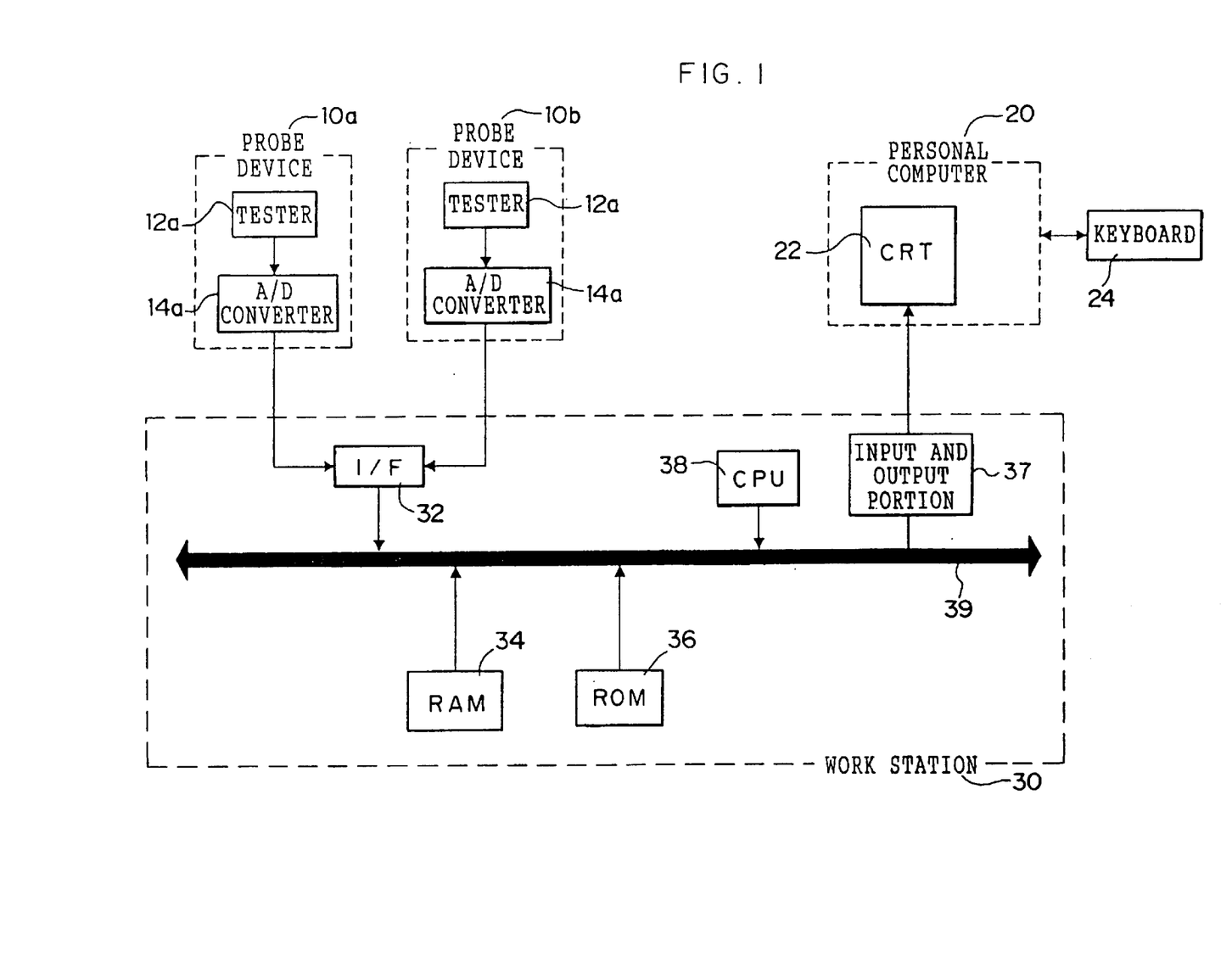
FIG. 1 is a block diagram showing a schematic structure of a semiconductor chip test apparatus according to an embodiment of the present invention.

As shown in FIG. 1, the semiconductor chip test apparatus according to the embodiment of the present invention basically comprises a first and a second wafer prober 10a and 10b which test semiconductor chips of different wafers substrates and which are independent from each other, a work station 30 connected to the first and the second wafer probers 10a and 10b for processing the output from the two wafer probers 10a and 10b on the basis of a display program which will be described later, and a personal computer 20 (hereinafter referred to as a PC) 20 for displaying respective test results of the two wafer probers 10a and 10b on a CRT 22 on the basis of display information from the work station 30.

The first wafer prober 10a is provided with a tester 12a at which are provided sixteen groups of probes arranged in eight rows and two columns. The first wafer prober 10a outputs the test results for each of the relative positions of the groups of probes (hereinafter referred to as Devices For Testing, or DFT's) with respect to the tester.

A number indicative of the quality of the semiconductor chip is displayed as test results of the semiconductor chip. For example, the number 1 denotes a good product, 2 a product which can be made good through a very simple correction processing, 3 a product which can be made good through a relatively simple correction processing, 4 a product which can be made good through a complicated correction processing, 5 a device failure, 6 a memory failure, and 7 a function failure. The semiconductor chips which are judged to be levels 1 through 4 are regarded as chips which have "passed" while the semiconductor chips which are judged to be levels 5 through 7 are regarded as chips which have "failed".The total numbers of semiconductor chips which have "passed" and "failed" are counted for each. It goes without saying that the method for displaying the test results is not limited to such a method. The operator can determine the display method depending on the test contents and the required test results each time.

In addition, a DC power source (not shown) is connected to the tester 12a, and a certain level of voltage is applied to each of the sixteen DFT'□. The output from each of the sixteen DFT's is converted into a digital value by an A/D converter 14a. This output includes position information of the DFT that outputs this output and position information of the tested semiconductor chip on the wafer substrate. The second wafer prober 10b has the same structure as the first wafer prober 10a, and explanation thereof is omitted.

The PC 20 displays the test results on the CRT 22 on the basis of the data from an input and output portion 37 (which will be described later). In addition, the PC 20 outputs to the input and output portion 37 an instruction inputted by the operator from a keyboard 24.

The work station 30 basically comprises an interface (I/F) 32, a RAM 34, a ROM 36, the input and output portion 37, and a CPU (a control portion) 38 which are connected via a bus 39.

The outputs from the two wafer probers 10a and 10b are inputted to the interface (I/F) 32, and are stored in the RAM 34 as two independent test result data from the interface (I/F) 32 through the bus 39.

A display program, a display mode switching program and a screen switching program are stored in the ROM 36. The display program corresponds the test results of the measured semiconductor chips (first information) with the positions of the semiconductor chips on the wafer substrate. Further, the display program is a program for calculating the pass/fail ratio which is a value reflecting the detection ratio of the defective products for each of the DFT's on the basis of the position information of the respective DFT's and the test results by the respective DFT's.

The display mode switching program is a program for switching (changing over) the display mode between a display mode 1 for displaying the test results of the semiconductor chips on the CRT 22 of the PC 20 in correspondence with the positions on the wafer substrate, a display mode 2 for displaying on the CRT 22 of the PC 20 the pass/fail ratio for each of the DFT's, and a display mode 3 for displaying on the CRT 22 of the PC 20 the pass/fail ratio for each of the DFT's in parallel with the test results of the semiconductor chips in correspondence with the positions on the wafer substrate. Namely, in the display mode 3, the pass/fail ratio and the test results are displayed in one screen of the CRT 22.

Furthermore, the screen switching program is a program for switching the display mode between a parallel display mode for displaying the test results of each of the wafer probers simultaneously by dividing a screen of the CRT 22 of the PC 20 in accordance with the number of the wafer probers which are connected, and a selected display mode in which one of the wafer probers is selected, the test results of the selected wafer prober are displayed on the entire screen, and instructions may be given to select another wafer prober to display the test results of that wafer prober.

In the present embodiment, since the two wafer probers 10a and 10b are connected, processing is performed such that the screen is divided into two portions in the parallel display mode. In addition, in the selected display mode, processing is performed so that the test results of one of the two wafer probers 10a and 10b are displayed on one screen.

The CPU 38 reads the data of the test results stored in the RAM 34, and carries out data processing on the basis of the display program which is called up from the ROM 36. The data displayed on the CRT 22 of the PC 20 on the basis of the display mode switching program and the screen switching program are output to the input and output portion 37 via the bus 29. The input and output portion 37 is connected to the PC 20 so that the results of processing by the CPU 38 are output to the PC 20.

Figure 2:
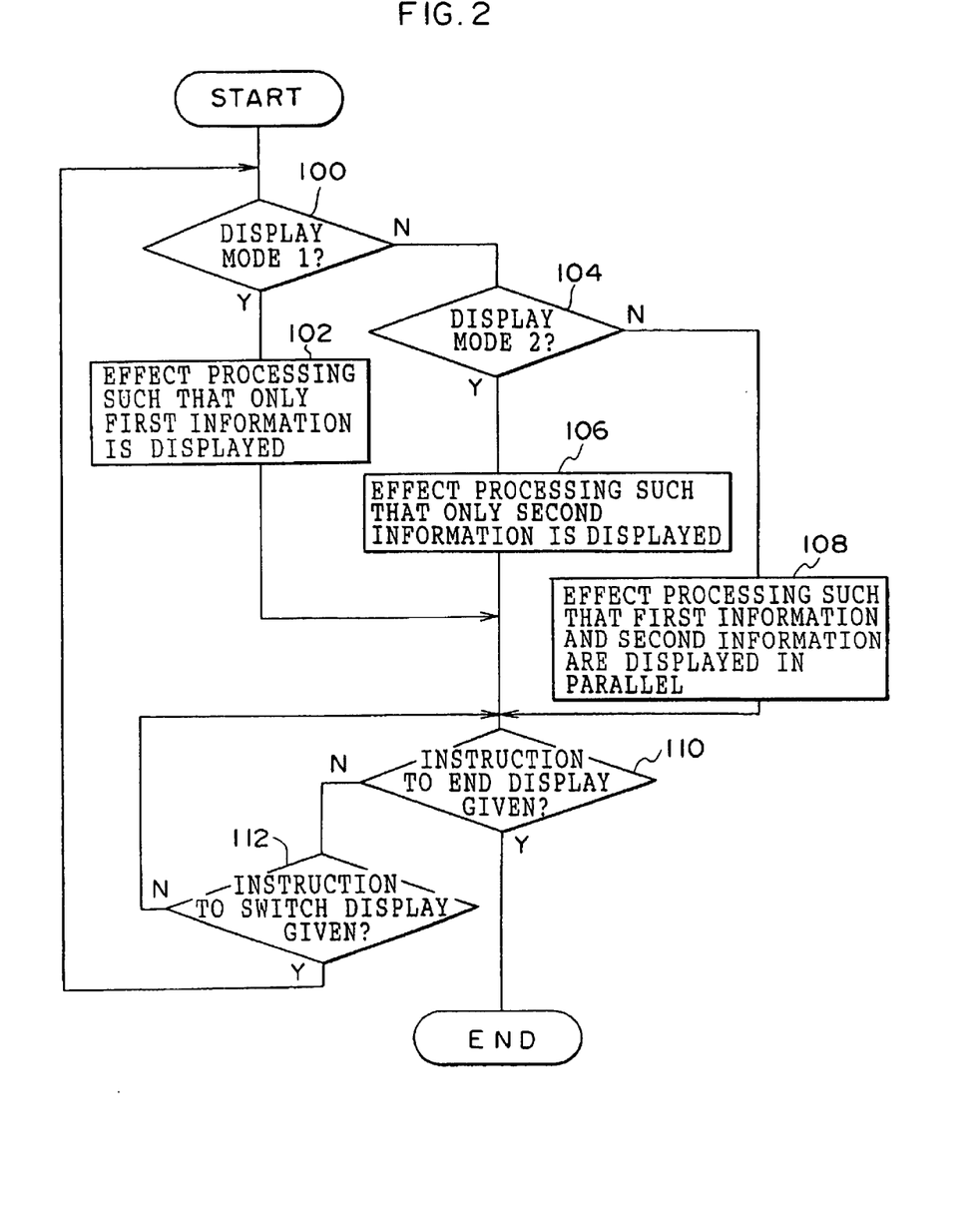
FIG. 2 is a flowchart showing an operation of a CPU based on a display mode switching program in the semiconductor chip test apparatus according to the embodiment of the present invention.

Here, operation of the CPU 38 on the basis of the display mode switching program will be explained by referring to the flowchart of FIG. 2.

First, at step 100, a judgment is made as to whether or not the display mode instructed by the PC 20 is the display mode 1. When it is judged at step 100 that the display mode is the display mode 1, the process proceeds to step 102 where, on the basis of test results data read from the RAM 34, processing is performed in such a manner that the test results of the semiconductor chips (the first information) are displayed on the CRT 22 of the PC 20 in correspondence to the positions on the wafer substrate, and the routine proceeds to step 110.

At step 100, when it is judged that the mode is not the display mode 1, the process proceeds to step 104 where a judgment is made as to whether or not the display mode instructed by the PC 20 is the display mode 2.

At step 104, if it is judged that the mode is the display mode 2, the process proceeds to step 106. Processing is carried out in such a manner that the pass/fail ratio for each of the DFT's (second information) which is calculated on the basis of the test results data read from the RAM 34 is displayed on the CRT 22 of the PC 20, and the process proceeds to step 110.

At step 106, if it is judged that the mode is not the display mode 2, it is judged that the mode is the display mode 3, and the routine proceeds to step 108. In step 108, processing is performed such that the test results of the semiconductor chips are displayed on the CRT 22 of the PC 20 in correspondence to the positions on the wafer substrate, and such that the pass/fail ratio for each of the DFT's is displayed in parallel with the test results of the semiconductor chip, and the process proceeds to step 110.

At step 110, a judgment is made as to whether or not an instruction has been given to end display by the CRT 22 of the PC 20. When it is judged that no instruction to end display has been given, the process proceeds to step 112 where a judgment is made as to whether or not an instruction has been given to switch the display.

At step 112, when it is judged that an instruction has been given to switch the display, the process returns to step 100 and the processings described above are repeated. When it is judged at step 112 that no instruction has been given to switch the display, the process returns to step 110, and a judgment is made as to whether or not an instruction has been given to end display by the CRT 22 of the PC 20.

On the other hand, when it is judged in step 110 that an instruction has been given to end display, the routine ends.

Figure 3A:
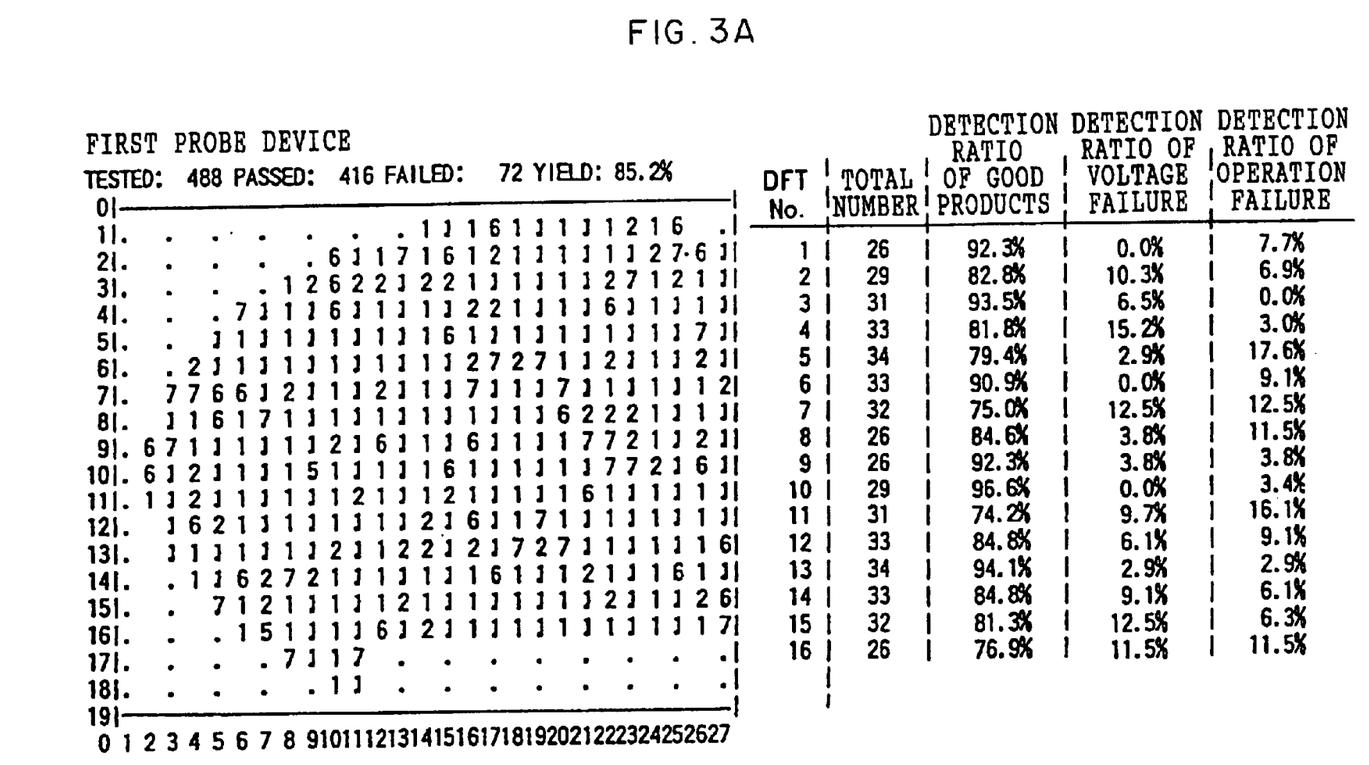
FIG. 3A and FIG. 3B are a view showing an example of a display of the semiconductor chip test apparatus according to the embodiment of the present invention.
Figure 3B:
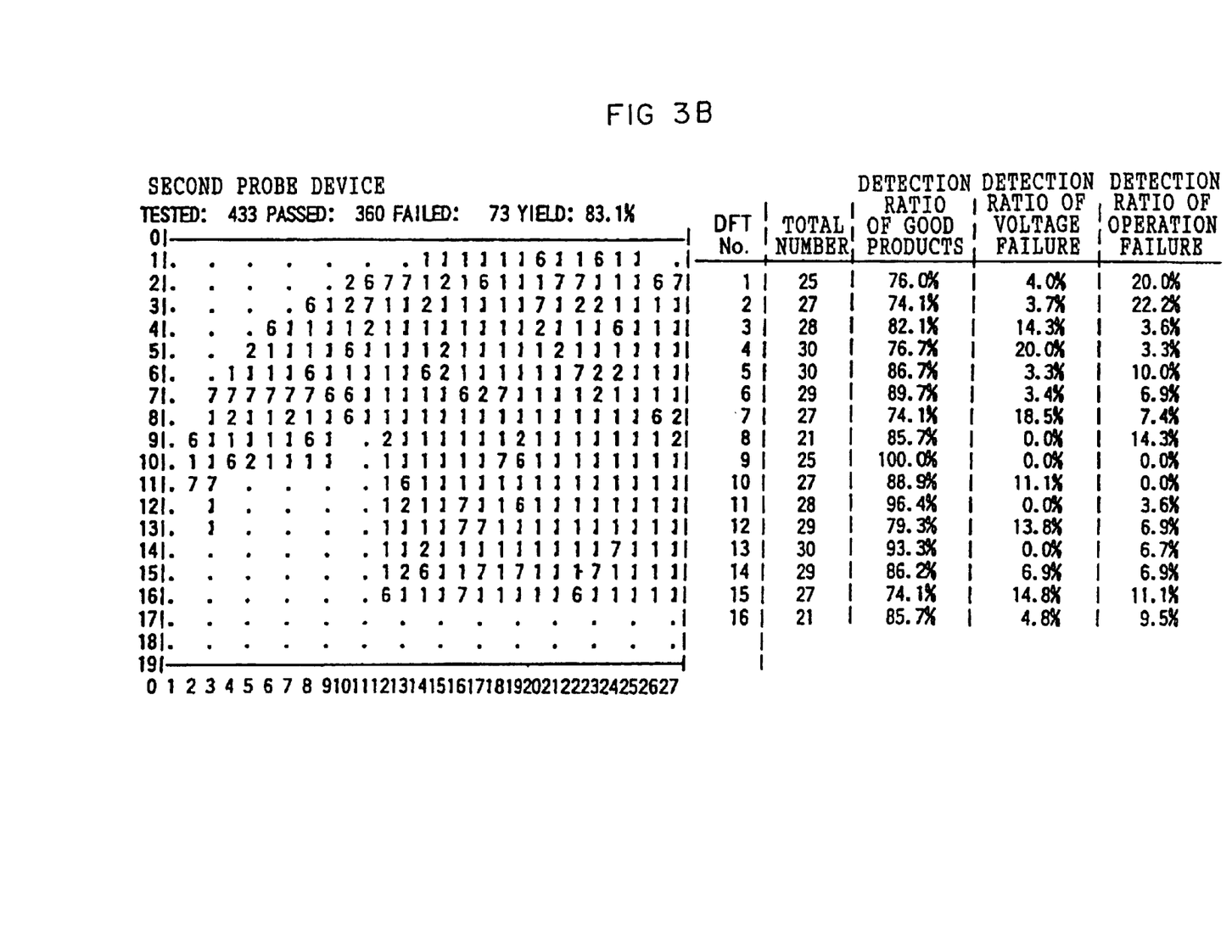

As described above, the test results of the semiconductor chips are displayed on the CRT 22 of the PC 20 in correspondence to the positions on the wafer substrate. Further, by providing the display mode 3 for displaying in parallel the test results and the pass/fail ratios for the respective DFT's, the test results of the semiconductor chips and the pass/fail ratios for the respective DFT's are displayed in parallel as illustrated in FIG. 3A and FIG. 3B. Thus, the existence of broken probes can be confirmed quite easily at the same time as testing the semiconductor chips, at all of the positions that the tester can be positioned at on the semiconductor substrate. Furthermore, the damage of the probes for each of the DFT's can be detected at an early stage.

Furthermore, there is also the advantage that a display mode suitable for the operator can be selected because the display state can be selected by switching the display mode of the test results between three kinds of display modes: a display mode for only the testing of the semiconductor chips, a display mode for only checking destruction of the probes, and a display mode for checking destruction of the probes and for the testing of the semiconductor chips.

Figure 4:
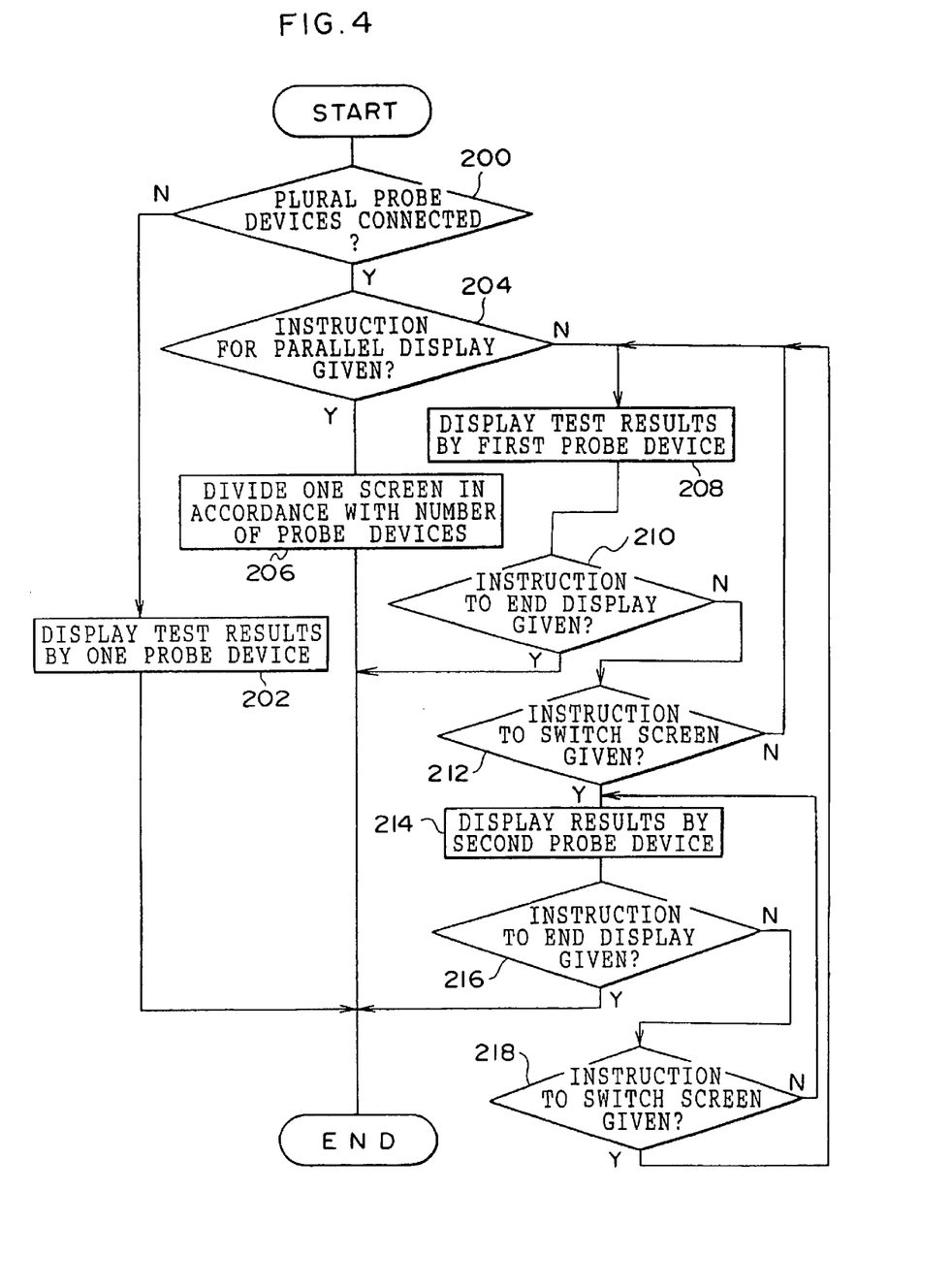
FIG. 4 is a flowchart showing an operation of the CPU based on a screen switching program in the semiconductor chip test apparatus of FIG. 1.

Operation of the CPU 38 on the basis of the screen switching program will be explained by referring to the flowchart of FIG. 4. First, at step 200, judgment is made as to whether or not a plurality of wafer probers are connected.

At step 200, if it is judged that a plurality of wafer probers are not connected, the process proceeds to step 202 where processing is performed in such a manner that the test results by the wafer prober is displayed on the entire CRT 22 of the PC 20. Then, the routine ends.

Figure 5A:
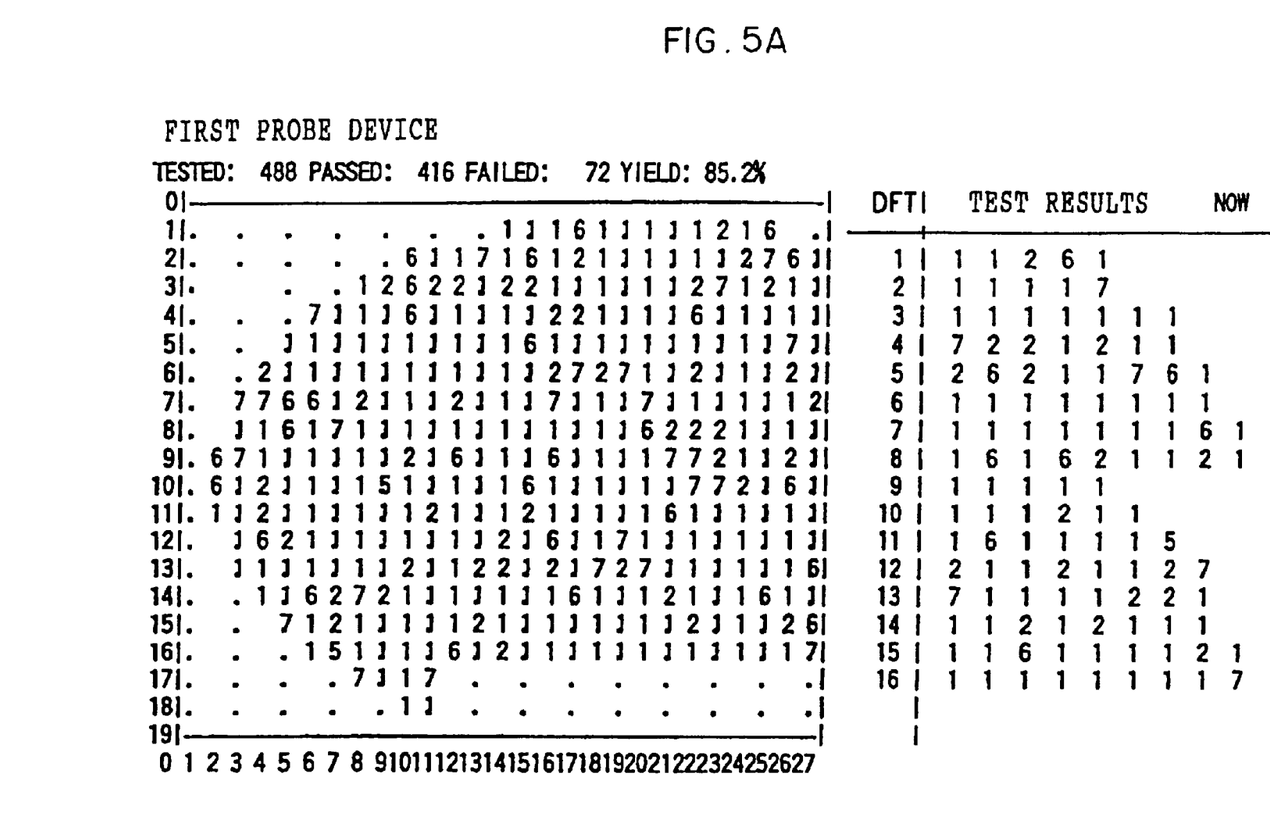
FIG. 5A and FIG. 5B are a view showing a different example of a display of the semiconductor chip test apparatus according to the embodiment of the present invention.
Figure 5B:
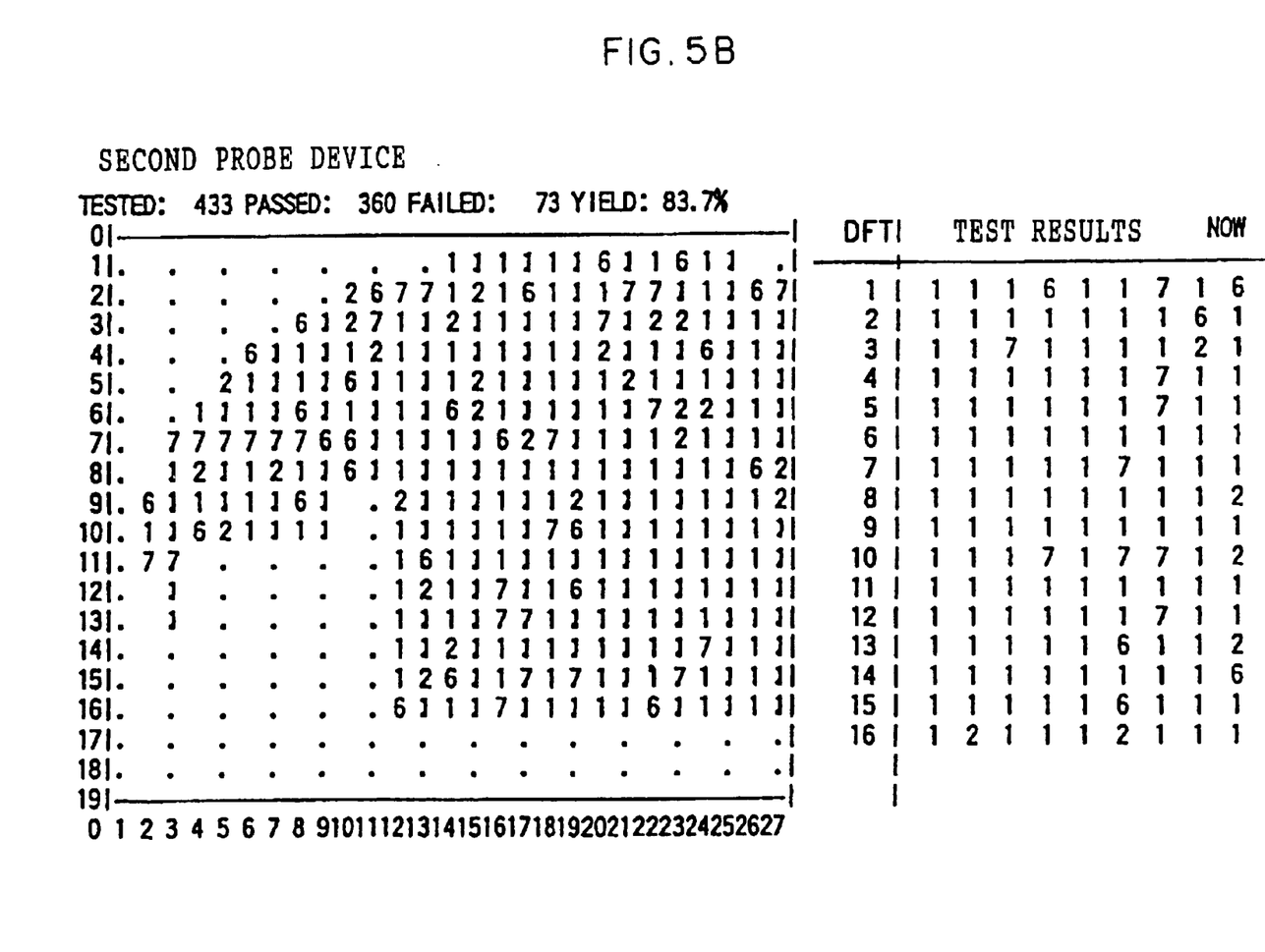

Furthermore, at step 200, if it is judged that a plurality of wafer probers are connected, the routine proceeds to step 204 where a judgment is made as to whether or not an instruction for parallel display has been given. When it is judged at step 204 that an instruction for parallel display has been given, the process proceeds to step 206 where one screen on the CRT 22 of the PC 20 is divided into regions of a number corresponding to the number of the wafer probers such that the test results by one wafer prober are displayed in one divisional region. Then, this routine ends. In the present embodiment, since the two wafer probers 10*a* and 10*b* are connected, one screen is divided into two portions as shown in FIG. 5A and FIG. 5B so that the test results of the two wafer probers 10*a* and 10*b* can be displayed in the respective regions. Then, this routine ends.

Furthermore, when it is judged at step 204 that no instruction for parallel display has been given, the process proceeds to step 208 to set the display such that the test results by the first wafer prober 10*a* is displayed on the entire one screen.

At the subsequent step 210, it is judged whether or not an instruction has been given to end display. If it is judged that an instruction has been given to terminate display, the routine ends. Furthermore, if it is judged at step 210 that no instruction has been given to end display, a judgment is made at step 212 as to whether or not an instruction has been given to switch the screen.

If it is judged at step 212 that no instruction has been given to switch the screen, the process returns to step 208, and the aforementioned processings are repeated. Furthermore, if it is judged at step 212 that an instruction has been given to switch the screen, the process proceeds to step 214 to set the display so that the test results by the second wafer prober 10*b* is displayed on the one entire screen.

At the subsequent step 216, it is judged whether or not an instruction has been given to end display. If it is judged that an instruction has been given to terminate the display, the routine ends. Furthermore, if it is judged at step 216 that no instruction has been given to end display, a judgment is made at step 218 whether or not an instruction has been given to switch the screen.

If it is judged at step 218 that no instruction has been given to switch the screen, the process returns to step 214, and the aforementioned processings are repeated. Furthermore, the program is set such that if it is judged at step 218 that an instruction has been given to switch the screen, the test results of a different wafer prober is displayed on the entire one screen. In the present embodiment, since the number of connected wafer probers is two, the process returns to step 208, and the aforementioned processings are repeated.

As described above, since parallel display can be carried out to set the screen such that the test results by all of the connected wafer probers are displayed on one screen, the testing of the wafer substrate by all of the connected wafer probers can be confirmed at the same time, and thus, the efficiency of the testing processing improves. Furthermore, also in the case where the display is set in such a manner that the test results of the respective wafer probers are displayed on respective screens, switching between the respective screens can be carried out freely. Thus, such display is preferable because a screen suited to the operator can be switched to, for example, in such a manner that the screen is switched each time a predetermined time passes in order for the operator to check the test results or the like of the respective wafer probers.

In the present embodiment, the pass/fail ratio is calculated from the test results obtained for each of the DFT's, and is displayed☐. Since it is preferable that the operator be informed when the detection ratio of poor products by a DFT is unusually large, the display is not limited to the display of the pass/fail ratio for each of the DFT's. For example, as shown in FIG. 5, the test results may be displayed for each of the DFT's, and the detection ratio of the poor products may be displayed. Any value may be displayed as long as it reflects the detection ratio of the poor products.

In the embodiment described above, the ROM 36 stores the display program, the display mode switching program, and the screen switching program. However, the present invention is not limited to the same. These programs may be stored on a floppy disk, and, at the same time, the main body of the computer may be provided with a hard disk so that the program may be read from the floppy disk to be installed in the hard disk. Or, the programs may be installed by transmission through a transmission means via a wired or wireless network (for example, telephone line). The programs do not have to be stored on a floppy disk. The programs may be stored in a CD-ROM or a magnetic tape and then installed from the CD-ROM or the magnetic tape into the hard disk. Furthermore, a hard disk storing the programs may be provided. Still further, the programs may be written directly on the hard disk or the RAM of the PC. In this manner, the programs may be transmitted via at least one of a concrete recording medium or transmission means.

What is claimed is:

1. A method for manufacturing a semiconductor device comprising the steps of:
    testing a plurality of semiconductor chips formed on a wafer substrate by a tester including plural testing portions for testing semiconductor chips; and
    on the basis of test results obtained by the tester, displaying on a same screen of a displaying device two types of information, which are
        a first information which expresses test results of the semiconductor chips in accordance with positions of the semiconductor chips on the wafer substrate, and
        a second information which expresses, for each of the testing portions, test results of the semiconductor chips obtained by the testing portions.

2. A method for manufacturing a semiconductor device according to claim 1, wherein the two types of information obtained from at least two testers are displayed on the same screen of the displaying device.

3. A method according to claim 2, wherein a display mode is switchable between at least three display modes, which are a first display mode for displaying only the first information on the screen of the displaying device, a second display mode for displaying only the second information on the screen of the displaying device, and a third display mode for displaying both the first information and the second information on the screen of the displaying device.

4. A method according to claim 2, wherein the test results of the second information is at least one of a detection ratio of defective semiconductor chips and a value reflecting the detection ratio.

5. A method according to claim 1, wherein a display mode is switchable between at least three display modes, which are a first display mode for displaying only the first information on the screen of the displaying device, a second display mode for displaying only the second information on the screen of the displaying device, and a third display mode for displaying both the first information and the second information on the screen of the displaying device.

6. A method according to claim 5, wherein the test results of the second information is at least one of a detection ratio of defective semiconductor chips and a value reflecting the detection ratio.

7. A method according to claim 1, wherein the test results of the second information is at least one of a detection ratio of defective semiconductor chips and a value reflecting the detection ratio.

8. A method for manufacturing a semiconductor device comprising the steps of:
    testing a plurality of semiconductor chips formed on a wafer substrate by a tester including plural testing portions for testing semiconductor chips; and
    displaying on a screen of a displaying device information based on test results obtained by the tester,
    wherein a display mode is switchable between at least three display modes, which area first display mode for displaying only a first information on the screen of the displaying device, a second display mode for displaying only a second information on the screen of the displaying device, and a third display mode for displaying simultaneity both the first information and the second information on the same screen of the displaying device,
    wherein the first information expresses test results of the semiconductor chips in accordance with positions of the semiconductor chips on the wafer substrate, and
    wherein the second information expresses, for each of the testing portions, test results of the semiconductor chips obtained by the testing portions.

9. A method according to claim 8, wherein the test results of the second information is at least one of a detection ratio of defective semiconductor chips and a value reflecting the detection ratio.

* * * * *